United States Patent
Ren et al.

(10) Patent No.: US 11,874,317 B2
(45) Date of Patent: Jan. 16, 2024

(54) GROUND FAULT DIRECTIONALITY DETECTION METHOD, DEVICE AND COMPUTER READABLE STORAGE MEDIUM

(71) Applicant: Schneider Electric Industries SAS, Rueil-Malmaison (FR)

(72) Inventors: Rui Ren, Shanghai (CN); Rong Li, Shanghai (CN)

(73) Assignee: Schneider Electric Industries SAS, Rueil-Malmaison (FR)

(*) Notice: Subject to any disclaimer, the term of this patent is extended or adjusted under 35 U.S.C. 154(b) by 0 days.

(21) Appl. No.: 17/397,265

(22) Filed: Aug. 9, 2021

(65) Prior Publication Data
US 2022/0043046 A1    Feb. 10, 2022

(30) Foreign Application Priority Data
Aug. 10, 2020 (CN) .......................... 202010794832.0

(51) Int. Cl.
*G06N 3/04* (2023.01)
*G01R 31/08* (2020.01)

(52) U.S. Cl.
CPC .............. *G01R 31/088* (2013.01); *G06N 3/04* (2013.01)

(58) Field of Classification Search
CPC ...... G01R 31/088; G01R 31/08; G01R 31/52; G01R 31/58; G06N 3/04; G06N 3/0454; G06N 3/0481; G06N 3/084; G06N 3/08; H02H 3/16; H02H 1/0092; H02H 1/00
See application file for complete search history.

(56) References Cited

FOREIGN PATENT DOCUMENTS

| | | | | |
|---|---|---|---|---|
| CN | 108279364 A | * | 7/2018 | ........... G01R 31/088 |
| EP | 1890165 A2 | * | 2/2008 | ........... G01R 31/025 |
| EP | 1890165 A2 | | 2/2008 | |
| EP | 3460494 A1 | * | 3/2019 | |
| FR | 2936319 A1 | | 3/2010 | |
| WO | WO-2015118163 A1 | * | 8/2015 | ........... G01R 31/086 |

OTHER PUBLICATIONS

Extended European Search Report dated Jan. 19, 2022 for corresponding European Patent Application No. 21306105.4-1202, 8 pages.

* cited by examiner

*Primary Examiner* — Tarun Sinha
*Assistant Examiner* — James I Burris
(74) *Attorney, Agent, or Firm* — Locke Lord LLP (57) ABSTRACT

A ground fault directionality detection method, a ground fault directionality detection device and a computer-readable storage medium for a small current grounding system are disclosed. The ground fault directionality detection method comprises sampling at least a part of a current signal to obtain a numerical matrix; providing the numerical matrix as an input to a ground fault directionality detection neural network; calculating a label vector corresponding to the numerical matrix by the ground fault directionality detection neural network, wherein the label vector indicates whether the current signal is an upstream fault current signal or a downstream fault current signal; receiving a ground fault confirmation signal by the ground fault directionality detection neural network; and outputting the label vector by the ground fault directionality detection neural network when the ground fault confirmation signal indicates that the current signal is a ground fault current signal.

11 Claims, 8 Drawing Sheets

GROUND FAULT DIRECTIONALITY DETECTION METHOD, DEVICE AND COMPUTER READABLE STORAGE MEDIUM

TECHNICAL FIELD

The present disclosure relates to a ground fault directionality detection method, device and computer-readable storage medium, and more particularly, to a ground fault directionality detection method used in a small current grounding system.

BACKGROUND

In a small current grounding system, when a ground fault occurs on a line, the power device on the line (e.g., Ring Main Unit, etc.) may run with the fault for a period of time (generally no more than 2 hours). During this period of time, it is necessary to diagnose the direction of the ground fault and judge whether the ground fault is a downstream fault (i.e., an internal fault) or an upstream fault (i.e., an external fault), so as to inform a corresponding maintenance team to carry out maintenance.

SUMMARY OF THE INVENTION

The present disclosure relates to a method and device for detecting the directionality of a ground fault based on a neural network and only requiring current information without voltage information.

According to an aspect of the present disclosure, a ground fault directionality detection method is disclosed. The method comprises sampling at least a part of a current signal to obtain a numerical matrix; providing the numerical matrix as an input to a ground fault directionality detection neural network; calculating a label vector corresponding to the numerical matrix by the ground fault directionality detection neural network, wherein the label vector indicates whether the current signal is an upstream fault current signal or a downstream fault current signal; receiving a ground fault confirmation signal by the ground fault directionality detection neural network; and outputting the label vector by the ground fault directionality detection neural network when the ground fault confirmation signal indicates that the current signal is a ground fault current signal.

Optionally, the method further comprises detecting whether a maximum value in the numerical matrix is greater than a preset enabling threshold; and only when the maximum value in the numerical matrix is greater than or equal to the preset enabling threshold, the numerical matrix is provided as the input to the ground fault directionality detection neural network.

Optionally, the current signal is a three-phase current signal, and one row or one column of the numerical matrix corresponds to one phase of the three-phase current signal.

Optionally, the ground fault directionality detection neural network adopts a convolution neural network.

Optionally, the ground fault directionality detection neural network is a trained neural network, and the training includes the following steps: step 1, acquiring a ground fault current signal training sample set for training the ground fault directionality detection neural network; step 2, providing a training sample in the ground fault current signal training sample set as an input to the ground fault directionality detection neural network; step 3, calculating a label vector corresponding to the training sample by the ground fault directionality detection neural network; step 4, determining a processing loss of the ground fault directionality detection neural network based on the label vector of the training sample; step 5: if the processing loss is greater than or equal to a preset processing loss threshold, updating a parameter of the ground fault directionality detection neural network and perform steps 2 to 5 based on the updated ground fault directionality detection neural network, and if the processing loss is less than or equal to the preset processing loss threshold, stopping the training.

Optionally, the ground fault directionality detection neural network includes at least a convolution layer, a first fully connected layer, a second fully connected layer, an activation layer and an output layer; and the parameter of the ground fault directionality detection neural network includes at least a weight matrix of a convolution kernel included in the convolution layer, a first weight matrix included in the first fully connected layer, and a second weight matrix included in the second fully connected layer.

Optionally, the ground fault directionality detection neural network may also include a pooling layer.

Optionally, the convolution layer adopts a convolution kernel with a size of 5×5; and the activation function is one of sigmoid function, relu function and tan h function.

Optionally, one or more training samples in the ground fault current signal training sample set are generated by an Electro-Magnetic Transient Program EMTP.

According to another aspect of the present disclosure, a ground fault directivity detection device is provided. The device comprises a sampling module, configured to sample at least a part of a current signal to obtain a numerical matrix; an input module, configured to provide the numerical matrix as an input to a ground fault directionality detection neural network; and a classification module, configured with the ground fault directionality detection neural network, wherein the ground fault directionality detection neural network calculates a label vector corresponding to the numerical matrix, wherein the label vector indicates whether the current signal is an upstream fault current signal or a downstream fault current signal, and the ground fault directionality detection neural network also receives a ground fault confirmation signal, and outputs the label vector when the ground fault confirmation signal indicates that the current signal is a ground fault current signal.

Optionally, the input module is further configured to detect whether a maximum value in the numerical matrix is greater than a preset enabling threshold, and provide the numerical matrix as the input to the ground fault directionality detection neural network only when the maximum value in the numerical matrix is greater than or equal to the preset enabling threshold.

According to another aspect of the present disclosure, a ground fault directivity detection device is provided. The device comprises a processor; and a memory, wherein a computer-executable program is stored in the memory, and when the program is executed by the processor, the device is caused to execute the method any one of the above.

According to another aspect of the present disclosure, there is provided a computer-readable storage medium having stored thereon computer instructions which, when executed by a processor, implement the method of any one of the above.

According to the above aspects of the present disclosure, by using a neural network to judge the directionality of ground fault, only current information is needed and voltage information is not needed, the shortcoming that the classical ground fault detection method needs both voltage information and current information to perform detection is overcome, and because of the obvious advantages of neural network in feature extraction and classification, the accuracy of ground fault directionality detection is improved.

BRIEF DESCRIPTION OF THE DRAWINGS

These and/or other aspects, features and advantages of the present disclosure will become clearer and easier to understand from the following description of the present disclosure taken in conjunction with the accompanying drawings, in which.

DESCRIPTION OF THE EMBODIMENTS

Hereinafter, the present disclosure will be described in detail with reference to exemplary embodiments thereof. However, the present disclosure is not limited to the embodiments described herein, but may be implemented in many different forms. The described embodiments are only used to make this disclosure thorough and complete, and to fully convey the concepts of this disclosure to those skilled in the art. The features of the various embodiments described may be combined or replaced with each other unless explicitly excluded or should be excluded according to the context.

At present, the methods used to detect the directionality of ground fault mainly include: the group amplitude comparison and phase comparison method, the principle of which is to select three or more lines with the largest zero-sequence current from the lines by "maximum value", and then to compare the phases of these three or more lines, and then to determine the one line of which the phase is different from that of the other lines as a grounding line, or to determine the bus is grounded if the phases of the three or more lines are the same; the fifth harmonic determination method, the principle of which is that the neutral point is grounded to the system via the arc suppression coil, and the fundamental component of the zero-sequence current in the system is very small due to the compensation of the arc suppression coil, so the line selection analysis and determination based on the fundamental component can not be realized, instead the zero-sequence current of the line contains rich harmonic components, so the amplitude and phases of the fifth harmonic component of the zero-sequence current of all lines may used for comparing; the active power determination method, the principle of which is that for the system with neutral point grounded to the system through arc suppression coil, the active component of zero sequence current of fault line is opposite to the polarity of normal line, his fact may be used for select line; the wavelet transform method, the principle of which is to determine the characteristic frequency band on which the transient current is most concentrated according to the principle of maximum energy, and then to compare the polarity of the first half wave of the modulus maximum of the characteristic frequency band of respective lines to determine the fault line; the first half-wave judgment method, the principle of which is that the polarity of the zero-sequence current of the fault line is opposite to that of the zero-continuation current of the normal line in the first half-wave of the fault, so the fault line can be selected by comparing the polarity of the zero-sequence current of the first half-waves; the median resistance method, the principle of which is that a set of resistor devices is connected to the neutral point of the system via a switch or connected in parallel with the arc suppression coil via an arc suppression coil, when a ground fault occurs, if it is a transient fault, the resistor will not be put into use; if it is a permanent ground fault, the switch will be closed and the resistor will not be put into use after a period of delay, and the active current generated by the resistor will only flow through the fault line; pulse current type, the principle of which principle is using a pulse current type small current grounding accurate line selection device to which a controllable pulse current generation device is added (that is, a set of resistor devices which can control and pulse output current is added to the neutral point of the system); the multi-frequency admittance method, the principle of which is that the discharge current to ground of three phases is mainly high-frequency capacitive current at the moment when the ground fault occurs, according to a certain weight, the high-frequency component of the current with a specific order is extracted in this time window, because the high-frequency capacitive current of the arc suppression coil is similar to an open circuit, the algorithm can refer to the vector method of ungrounded system and get the result according to the phase angle of zero-sequence voltage and zero-sequence current by selecting high-frequency components for processing.

However, some of these methods need to deploy additional voltage sensors to obtain voltage information, some need to use additional resistors or resistor devices to implement them, and some have poor reliability. For example, it is difficult to select the time window of waveforms used for polarity comparison in the first half-wave judgment method, and if the time window is not properly selected, it is possible to get completely opposite judgment results.

In view of the above situation, this disclosure provides a ground fault directivity detection method based on a neural network, which only needs current information of ground fault without voltage information.

Figure 1:
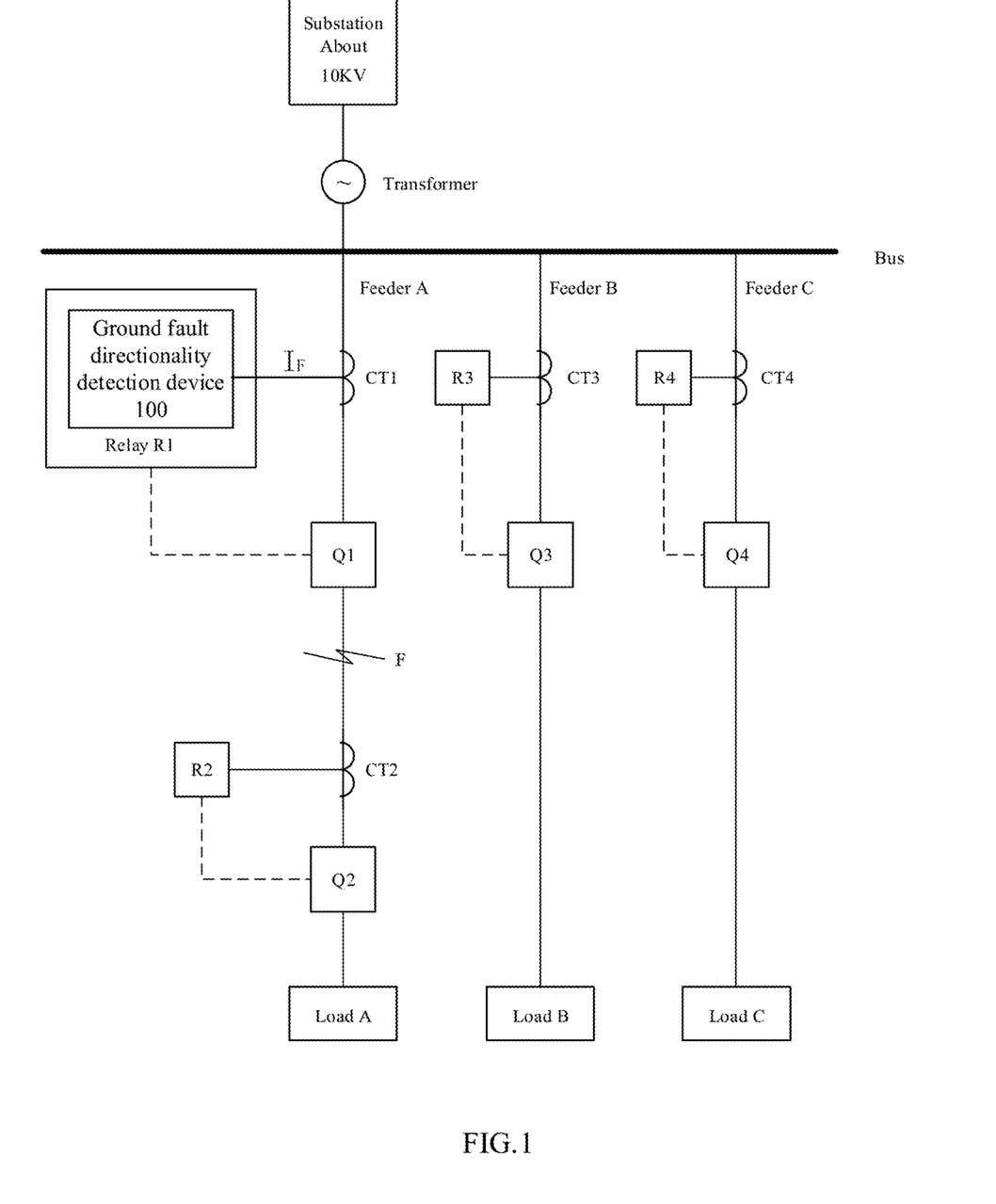
FIG. 1 is a usage scenario diagram of a ground fault directionality detection device according to an embodiment of the present disclosure.

FIG. 1 is a usage scenario diagram of a ground fault directionality detection device 100 according to an embodiment of the present disclosure.

The scenario shown in FIG. 1 may be used as an example of a small current grounding system, and the substation supplies power to loads A, B and C such as business centers and office buildings through a transformer. The transformer distributes voltages to feeders A, B and C through a bus to supply power to loads A, B and C via feeders A, B and C. Current transformers CT1 and CT2, relays R1 and R2 are arranged on feeder A, current transformers CT3 and relay R3 are arranged on feeder B, and current transformers CT4 and relay R4 are arranged on feeder C. In addition, circuit breakers Q1-Q4, loads, etc., and other unillustrated devices or apparatuses are arranged on respective feeders.

The ground fault directivity detection device 100 according to the embodiment of the present disclosure may be integrated into each relay R1-R4 as a part of the relay, or into other devices located outside the relay and exchanging data or commands with the relay via a wired or wireless network, or into a fault passage indicator FPI deployed on a line.

When a ground fault F occurs somewhere on the line, the ground fault directionality detection device 100 may sample a ground fault current signal $I_F$, detect the directionality of the current signal $I_F$, and generate a detection result, the detection result may indicate whether the current signal $I_F$ belongs to a current signal representing an upstream fault (hereinafter referred to as an upstream fault current signal) or a current signal representing a downstream fault (hereinafter referred to as a downstream fault current signal). The upstream fault and downstream fault are divided according to the protection range of a protection device (such as relays R1~R4 or FPI). For example, for each of relays R1~R4, faults occurring inside the protection range of itself are downstream faults, whereas faults occurring outside the protection range of itself are upstream faults. For example, when a fault F occurs at a position of the feeder line A as shown in FIG. 1, it is a downstream fault for the relay R1 and an upstream fault for the relays R2~R4. For example, when a fault F occurs, ground fault directionality detection devices 100 arranged in relays R1 and R2 respectively perform directionality detection on ground fault current signals $I_F$, and the ground fault directionality detection device 100 in relay R1 obtains a detection result indicating the fault F is a downstream fault, while the ground fault directionality detection device 100 in relay R2 obtains a detection result indicating the fault F is an upstream fault. Considering these detection results, it may be known that the fault occurred in the protection range of relay R1.

Specifically, the ground fault directionality detection device 100 is configured with a ground fault directionality detection neural network according to an embodiment of the present disclosure. With this neural network, feature extraction process may be performed on the ground fault current signal $I_F$, and a detection result may be generated based on the extracted features, and the detection result indicates whether the ground fault belongs to an upstream fault or a downstream fault. The ground fault directionality detection neural network needs to be trained in advance to be a neural network capable of performing fault detection directionality detection by using a training method of the ground fault directionality detection neural network according to the embodiment of the present disclosure.

In addition, the ground fault directionality detection device 100 may also output the detection result to a display device (not shown in this figure), which may display the detection result in a user-friendly manner such as text, numbers, and images.

In the embodiment of the present disclosure, because the detection result is generated by the ground fault directionality detection device 100 using the trained ground fault directionality detection neural network, with the obvious advantages of neural network in feature extraction and classification, it overcomes the shortcomings such as the need to collect voltage information, the need to put additional resistors into usage, and the low reliability of the detection result, and it realizes more efficient and accurate ground fault directionality detection.

Figure 2:
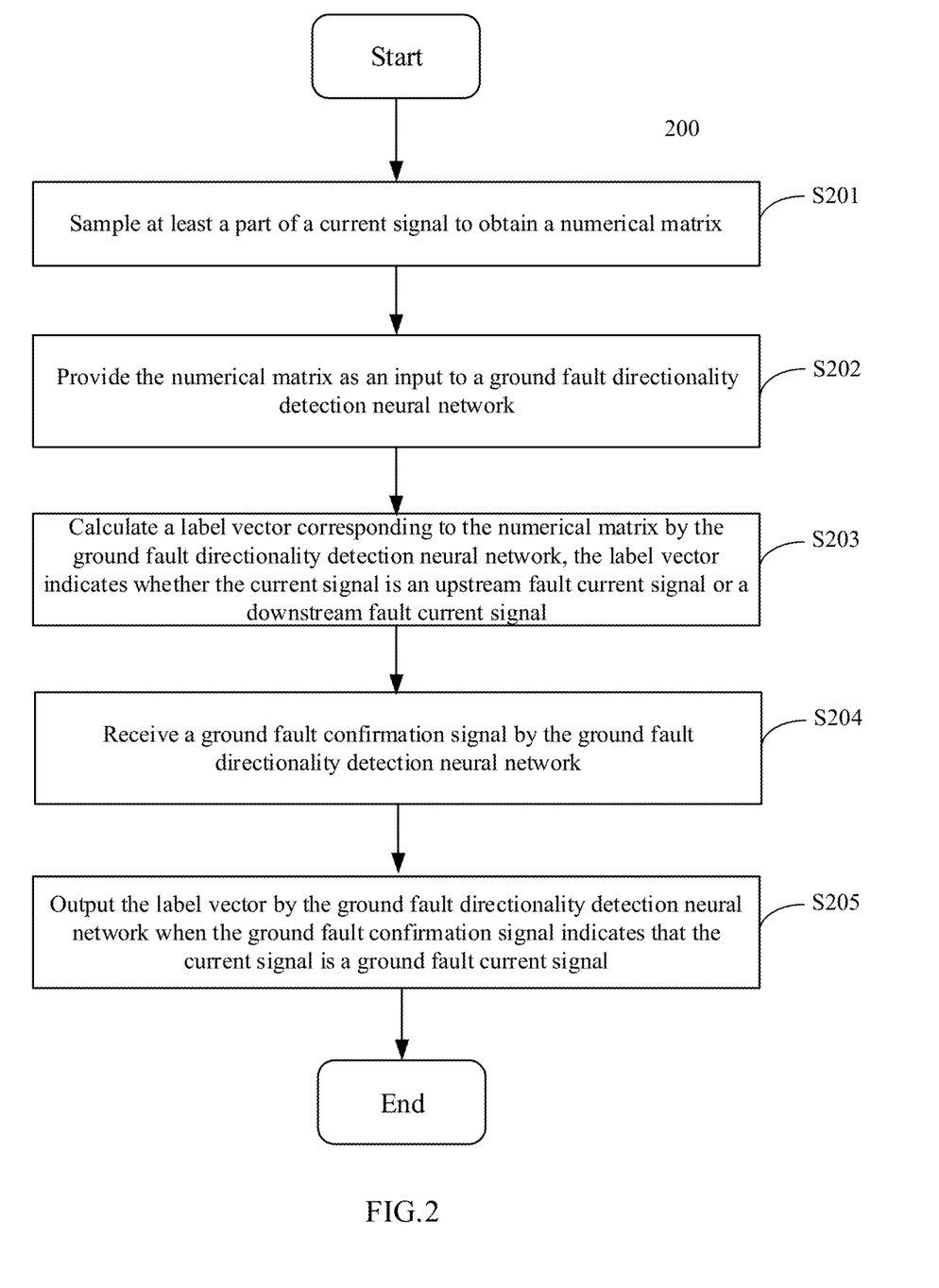
FIG. 2 is a flowchart of a ground fault directivity detection method according to an embodiment of the present disclosure.

FIG. 2 is a flowchart of a ground fault directivity detection method 200 according to an embodiment of the present disclosure.

The ground fault directionality detection method 200 shown in FIG. 2 may be implemented by the ground fault directionality detection device 100 in FIG. 1 in which a ground fault directionality detection neural network trained according to a training method of the embodiment of the present disclosure is configured. As shown in FIG. 2, the ground fault directivity detection method 100 may include steps S201-S205.

At step S201, at least a part of a current signal I is sampled to obtain a numerical matrix M. The current signal I in this step may also be a current signal after proper preprocessing, the proper preprocessing includes but is not limited to converting a ground fault current signal with a larger value into a current signal with a smaller value according to a certain ratio via a current transformer. In addition, in this step, when sampling the current signal I, a sampling resolution is k sampling points per power frequency cycle, and a value of k may be selected according to actual needs, for example, k=24, 32, 48, etc., and a sampling range is N cycles, for example, N=1, 2, etc. The numerical matrix M in this step is an arrangement of the sampled values of the ground fault current signal I, in which one row or one column corresponds to one phase of the current signal. For example, when the ground fault current signal I is a three-phase current, sampling N cycles will result in a numerical matrix M with a size of 3×Nk, and one row of the numerical matrix M corresponds to one phase of the three-phase current signal.

At step S202, the numerical matrix M is provided as an input to a ground fault directionality detection neural network. The ground fault directionality detection neural network is a trained neural network, and the training method for it will be described below with reference to FIG. 4.

In step S203, a label vector V corresponding to the numerical matrix M is calculated by the ground fault directionality detection neural network, and the label vector V indicates whether the current signal I is an upstream fault current signal or a downstream fault current signal. In this step, the ground fault directionality detection neural network performs feature extraction processing on the current signal I, and generates a detection result based on the extracted features. In other words, the ground fault directionality detection neural network performs a series of operations on the numerical matrix M input in step S203 to obtain a label vector V indicating whether the ground fault is an upstream fault or a downstream fault. A category corresponding to a maximum value in the label vector V is considered as a prediction result of the ground fault directionality detection neural network.

It should be noted that steps S201-S203 are performed on the assumption that the current signal I is a ground fault current signal. That is, if the current signal I is determined to be a ground fault current signal, the label vector V calculated in step S203 is valid, and if the current signal I is not determined to be a ground fault current signal, the label vector V calculated in step S203 is invalid. Therefore, in steps S204 and S205, it is further determined whether the label vector V should be output in combination with a ground fault confirmation signal. The reason for doing this is that in the small current grounding system, the capture opportunity of the ground fault current signal is very short, and it can only be captured during the fault transient with a short duration. If steps S201-S203 are performed after the current signal is determined as the ground fault current signal, the capture opportunity of the ground fault current signal may be missed. In other words, the generation process of the ground fault confirmation signal mentioned in the following steps S204 and S205 is synchronized with steps S201-S203.

In step S204, a ground fault confirmation signal is received by the ground fault directionality detection neural network. The ground fault confirmation signal may be a signal from other devices, apparatuses, or components (for example, other components in relays) calculated according to a specific algorithm, which may indicate whether the current signal in steps S201 to S203 is the ground fault current signal. A variety of principles well known to those skilled in the art may be used to determine whether the current signal is the ground fault current signal. For example, a current signal is considered as a ground fault current signal when it is monitored that a residual voltage signal continuously exceeds a threshold value for a period of time (in the case of no additional voltage sensor), such as 500 ms, or when it is monitored that the Fourier value of the residual current is continuously greater than or equal to 3 amps than the value before the fault. Since determining whether the current signal is a ground fault current signal is not the subject of this disclosure, it will not be described in detail to avoid obscuring this disclosure.

In step S205, when the ground fault confirmation signal indicates that the current signal I is a ground fault current signal, the label vector V is output by the ground fault directionality detection neural network. In this step, if the ground fault confirmation signal indicates that the current signal I analyzed in steps S201 to S203 is a ground fault signal, the label vector V calculated in step S203 is considered as valid, and the label vector V is output. On the contrary, if the ground fault confirmation signal indicates that the current signal I analyzed in steps S201 to S203 is not a ground fault signal, the label vector V calculated in step S203 is considered as invalid, and the label vector V is not output.

In the embodiment of this disclosure, the ground fault directionality detection neural network is used to judge whether the ground fault is an upstream fault or a downstream fault. Since it only needs to analyze the current signal without collecting voltage information, and the current transformer and relay in the line may collect the current signal, the ground fault detection method according to the embodiment of this disclosure may be implemented conveniently without considering the deployment of additional voltage sensors, which saves costs and makes fault directionality detection easier to perform. In addition, since the neural network has obvious advantages in feature extraction and feature-based classification, this method also improves the accuracy of directionality detection of the ground fault.

Figure 3:
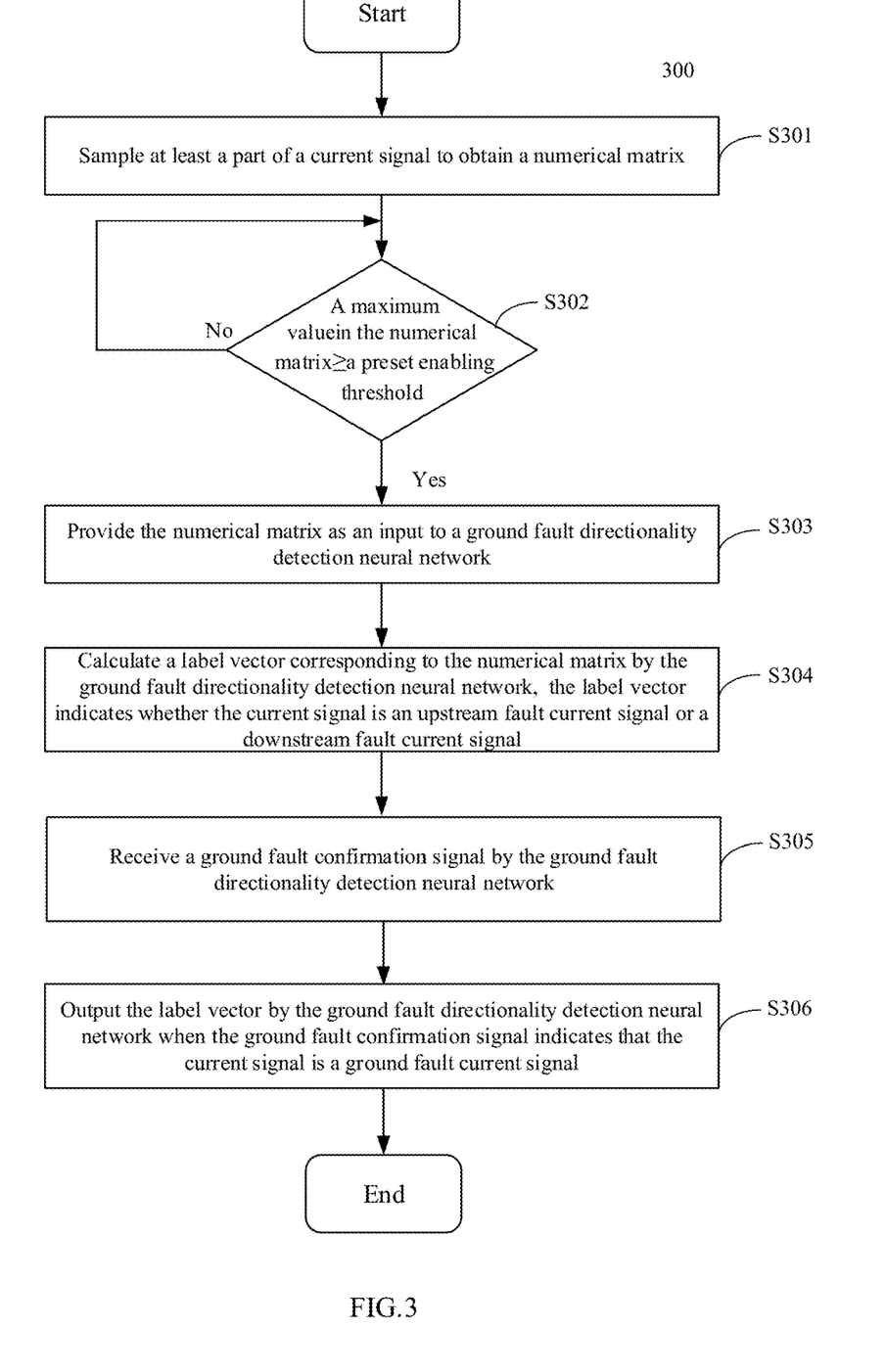
FIG. 3 is a flowchart of a ground fault directivity detection method according to another embodiment of the present disclosure.

FIG. 3 is a flowchart of a ground fault directivity detection method 300 according to another embodiment of the present disclosure.

In most cases, the ground fault only happens occasionally, so it is not necessary to analyze the directionality of the ground fault for the current signal at all times. When the ground fault occurs, the current value of the current signal usually increases, therefore, in order to save computing resources, an enabling threshold may be set for the ground fault directionality detection neural network.

As shown in FIG. 3, the ground fault directivity detection method 300 may include steps S301-S306. Step S301 in method 300 is the same as step S201 in FIG. 2, except that a judgment operation on a preset enabling threshold at step S302 is added.

At step S302, it is judged that whether a maximum value in the numerical matrix M obtained at step S301 is greater than a preset enabling threshold, and the maximum value corresponds to the maximum current value in the sampled current signal I. The preset enabling threshold $T_{enable}$ is a threshold value for enabling the ground fault directionality detection neural network to perform feature extraction and classification. $T_{enable}$ may be set according to actual needs, for example, it may be set as an abrupt change $X_{delta}$ of the sampling value of the current signal I, where $X_{delta}$ includes but is not limited to meeting $X_{delta}=X_k-X_{k-2N}$, where K is a number of sampling points per cycle, for example, k=48. The meaning of this equation is that a semaphore $X_{k-2n}$ in normal load state before the fault can be subtracted from a semaphore $x_k$ collected just after the fault occurs, and a semaphore before two sampling cycles may be taken as a reference quantity in a normal load state. The preset enabling threshold $T_{enable}$ may be changed manually, for example, according to a power environment within a protection range of the relay.

If the judgment result of step S302 is that the maximum value in the numerical matrix M is greater than or equal to the preset enabling threshold $T_{enable}$, method 300 proceeds to step S303. Similar to step S202 of method 200, in step S303, the numerical matrix M is provided as an input to the ground fault directionality detection neural network. Similar to step S203 of method 200, in step S304, a label vector V corresponding to the numerical matrix M is calculated by the ground fault directionality detection neural network, the label vector V indicates whether the current signal I is an upstream fault current or a downstream fault current. If the judgment result in step S302 is that the maximum value in the numerical matrix M is smaller than the preset enabling threshold $T_{enable}$, wait for the next numerical matrix M obtained in step S301. It should be understood that step S301 in FIG. 3 may be continuously performed, that is, the current signal I may be continuously sampled (for example, the sampling range for each sample is one cycle of the current signal I), so steps S302-S306 are repeated for each numerical matrix acquired in step S301.

Steps S305 and S306 are the same as steps S204 and S205 in FIG. 2, respectively, and will not be repeatedly described here.

In the embodiment of the present disclosure, the ground fault directionality detection neural network is enabled only after the preset enabling threshold is met, thus saving computing resources.

Figure 4:
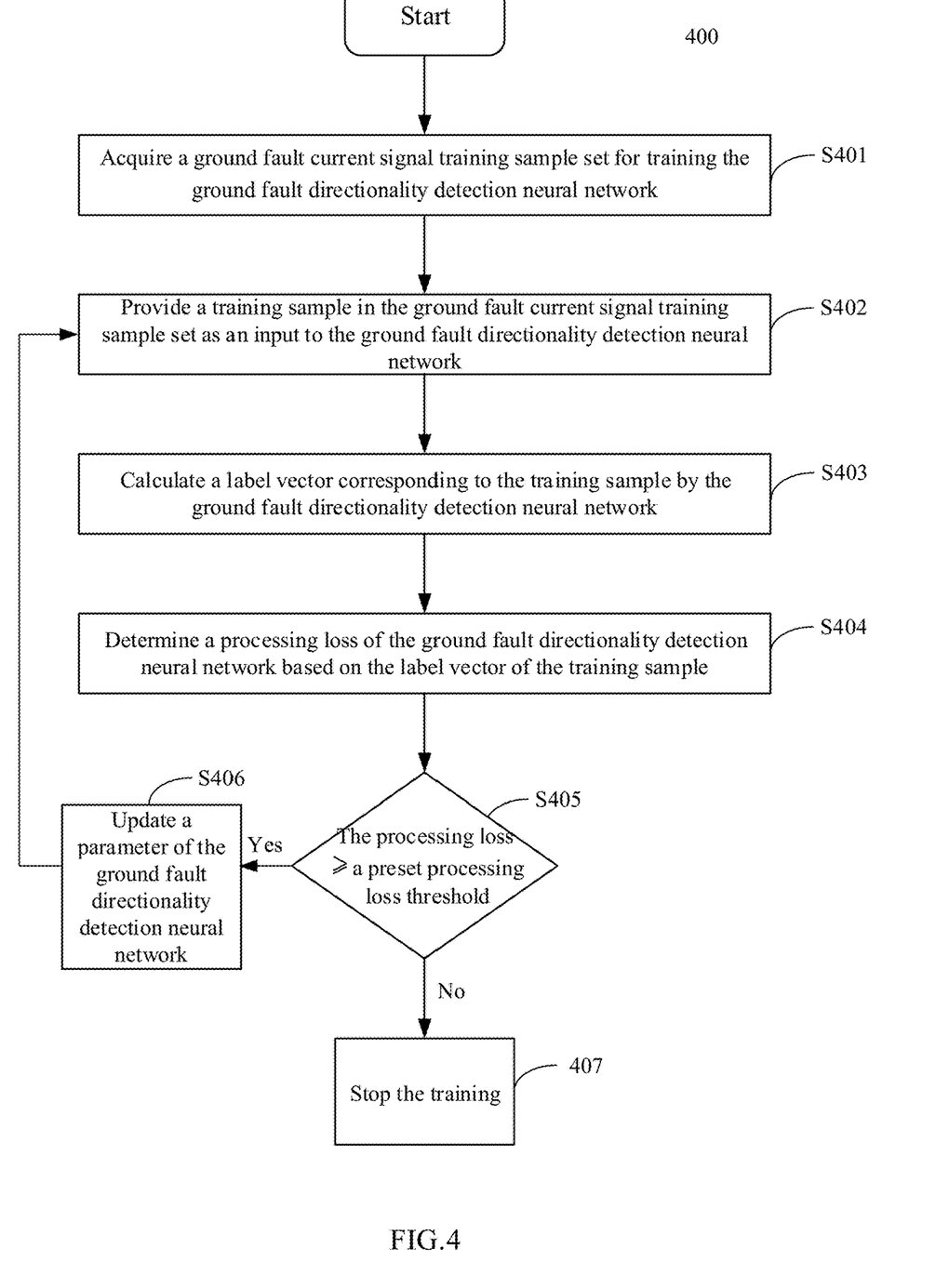
FIG. 4 is a flowchart of a training method of a ground fault directionality detection neural network according to an embodiment of the present disclosure.

FIG. 4 is a flowchart of a training method 400 of a ground fault directionality detection neural network according to an embodiment of the present disclosure.

As shown in FIG. 4, the training method 400 of the ground fault directionality detection neural network includes steps S401-S407.

At step S401, a ground fault current signal training sample set for training the ground fault directionality detection neural network is acquired. In an embodiment of the present disclosure, each sample in the ground fault current signal training sample set may be a ground fault current signal collected in an actual ground fault occurrence scenario or a ground fault current signal generated by an electromagnetic transient simulation program EMTP or other software programs according to a specific algorithm, and these ground fault current signals may include a current signal representing upstream fault and a current signal representing downstream fault. For example, when the collected ground fault current signals from the actual ground fault occurrence scene are too few to meet a sample size required for training the ground fault directionality detection neural network, the training samples generated by EMTP may be used as a supplement. For each sample in the ground fault current signal training sample set, no matter which one of the above two cases the sample comes from, the real label vector of the sample is known, and the label vector calculated by the ground fault directionality detection neural network should be consistent with the real label vector of the sample. Therefore, the goal of training the ground fault directionality detection neural network is to minimize the difference between the label vector calculated by the ground fault directionality detection neural network and the real label vector for each sample in the training sample set of the ground fault current signal.

At step S402, the training sample in the current signal training sample set is provided as the input to the ground fault directionality detection neural network. The training sample input in this step may be all samples, some samples or one sample of the training sample set depending on a sample size of the sample set, size of computing resources, requirements of network prediction accuracy, and so on.

At step S403, a label vector corresponding to the training sample is calculated by the ground fault directionality detection neural network. As mentioned above, the ground fault directionality detection neural network performs feature extraction on the training sample input in step S402, and classifies it according to the extracted features to obtain the label vector V indicating whether the current signal corresponding to the training sample is an upstream fault current signal or a downstream fault current signal.

At step S404, a processing loss of the ground fault directionality detection neural network is determined based on the label vector of the training sample. For the training sample input in step S402, the label vector output by the ground fault directionality detection neural network may be compared with the known real label vector. For example, it is known that, for a training sample which is actually a upstream fault, the real label vector is [1,0], indicating that the probability of the training sample being an upstream fault current signal is 1, and the probability of the training sample being a downstream fault current signal is 0; for a training sample which is actually a downstream fault, its real label vector is [0,1], indicating that that the probability of the training sample being an upstream fault current signal is 0, and the probability of the training sample being a downstream fault current signal is 1. When the training of the ground fault directionality detection neural network has not been completed, the output label vector of the training sample may be quite different from the real label vector of the training sample. For a training sample known as an upstream fault current signal, for example, the output label vector may be [0.2,0.8], indicating that the neural network considers that the sample is an upstream fault current signal with a probability of 0.2 and the sample is a downstream fault current signal with a probability of 0.8. The result shows that the neural network is completely wrong in detecting the sample. For another example, the calculated label vector is [0.7,0.3], indicating that the neural network considers that the sample is a downstream fault current signal with the probability of 0.7 and the sample is an upstream fault current signal with a probability of 0.3. Although this result shows that the training sample is more likely to be the upstream fault current signal than the downstream fault current signal, the difference between the training sample and the real label vector is still relatively large, that is, the accuracy is low, which has not yet reached the training goal of minimizing the difference between the label vector calculated by the neural network and the real label vector. The difference between the label vector output by the ground fault detection neural network and the real label vector may be measured by the processing loss L. The determination of processing loss L is related to a loss function selected for the ground fault directionality detection neural network. For example, the loss function may be one of the mean square error function, cross-entropy loss function, L1 loss function, L2 loss function, and the like. Corresponding to all samples, some samples or one sample of the training sample set input in step 402, the processing loss L may be determined according to Batch Gradient Descent (BGD), Mini-Batch Gradient Descent (SGD) or Stochastic Gradient Descent (MBGD).

At step S405, it is judged whether the processing loss L is greater than or equal to a preset processing loss threshold $T_L$. The preset processing loss threshold $T_L$ may be selected in combination with the prediction accuracy of the ground fault directionality detection neural network based on the protection range of the ground fault directionality detection device, for example, 0.01 and 0.02 may be selected. If it is judged that the processing loss L is greater than or equal to the preset processing loss threshold $T_L$, it is considered that the training of the ground fault directionality detection neural network has not been completed, and the process proceeds to step S406. On the contrary, if it is judged that the processing loss L is less than the preset processing loss threshold $T_L$, it is considered that the training of the ground fault directionality detection neural network has been completed, and the process proceeds to step S407.

At step S406, a parameter of the ground fault directionality detection neural network are updated. In this step, the back propagation algorithm may be used to update one or more parameters in the ground fault directionality detection neural network, these parameters mainly include weight parameters of each layer of the neural network, for example, a weight matrix of one or more convolution kernels in a convolution layer, a weight matrix of a first and/or second fully connected layer, etc. After the update is completed, steps S402 to S405 are repeated until it is judged in step S405 that the processing loss L is less than the preset processing loss threshold $T_L$, and then in step S407, the training of the ground fault directionality detection neural network is stopped.

Figure 5:
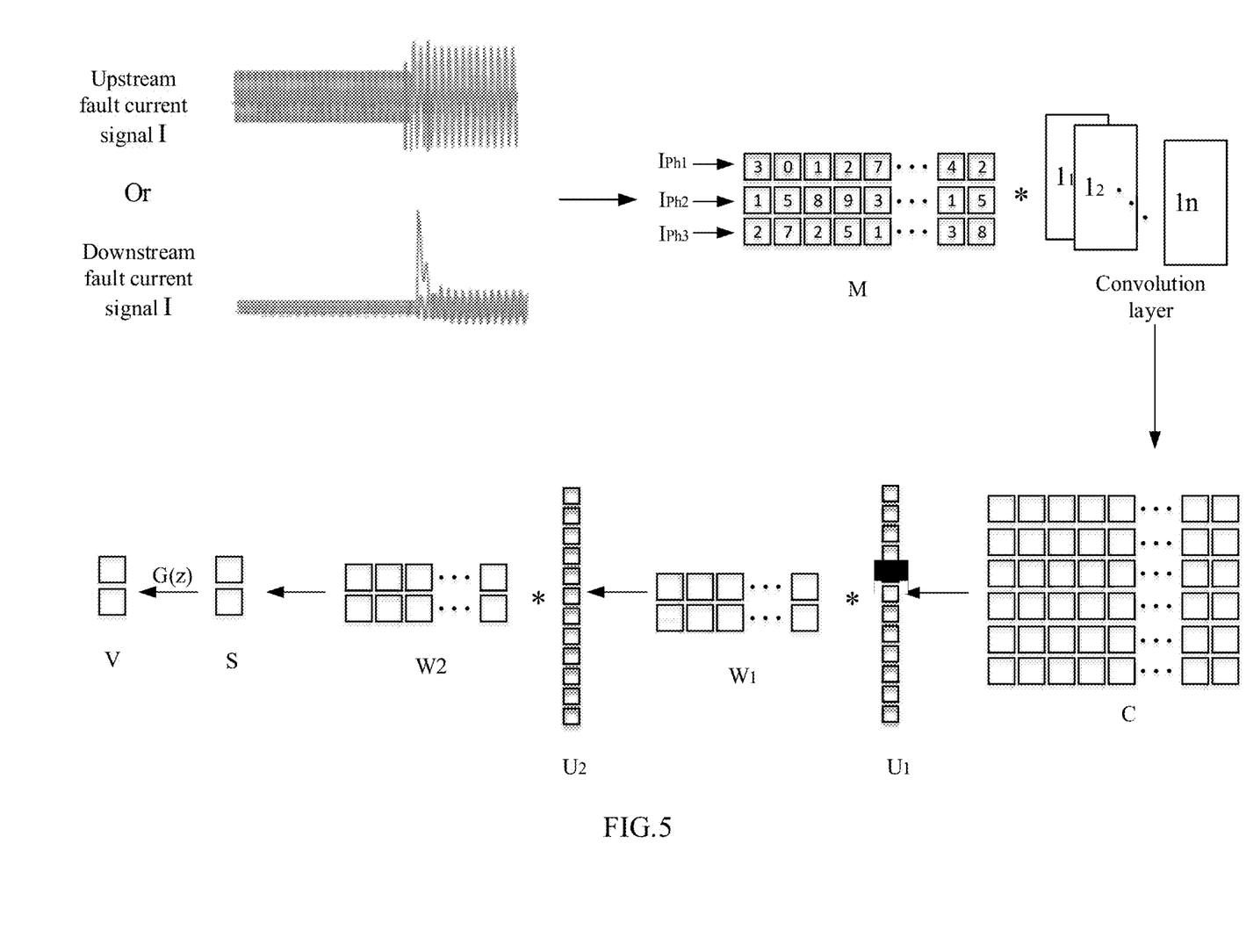
FIG. 5 is a structural schematic diagram of a ground fault directionality detection neural network according to an embodiment of the present disclosure.

FIG. 5 is a structural schematic diagram of a ground fault directionality detection neural network according to an embodiment of the present disclosure.

As shown in FIG. 5, the ground fault directionality detection neural network may be a convolutional neural network including a convolution layer, a first fully connected layer, a second fully connected layer, an activation layer and an output layer. The convolution layer may include n convolution kernels: convolution kernel 1, convolution kernel 2, . . . , and convolution kernel n. A numerical matrix input to the directionality detection neural network of ground fault is M.

After the numerical matrix M is input into the directionality detection neural network of a ground fault, it is first processed by the convolution layer. Each of the convolution kernels 1 to n included in the convolution layer is convoluted with the numerical matrix M to obtain a convolution result of the first convolution layer, that is, the numerical matrix C.

One row in the numerical matrix C corresponds to a convolution result of one of the convolution kernels 1 to n and the numerical matrix M.

Next, the numerical matrix C is expanded into one row or one column, and the expanded result is the first fully connected layer, which is denoted as the numerical matrix $U_1$.

Next, the numerical matrix $U_1$ is multiplied by a weight matrix $W_1$ of the first fully connected layer to obtain a second fully connected layer, which is denoted as the numerical matrix $U_2$.

Then, the numerical matrix $U_2$ is multiplied by a weight matrix $W_2$ of the second fully connected layer to obtain a weighted sum vector S.

At last, the weighted sum vector S is transformed into the label vector V by using an activation function G(z) of the activation layer. The label vector V may indicate whether the detected current signal is an upstream fault current signal or a downstream fault current signal. The activation function G(z) of the activation layer may include but is not limited to one of sigmoid function, relu function and tan h function.

It should be noted that the specific structure of the ground fault directionality detection neural network shown in FIG. 5 is only an example for convenience of explanation. Under specific circumstances, the structure may be changed and modified without departing from the protection scope of this disclosure. For example, in order to reduce the amount of data to be calculated, a pooling layer may be included after the convolution layer, and the pooling layer may adopt an average pooling method or a maximum pooling method to reduce the dimension of the result numerical matrix C of the convolution layer; for another example, a number of convolution layers, pooling layers, fully connected layers, active layers, etc., may be modified according to the training situation of the ground fault directionality detection neural network, for example, when the training process is over-fitted, the structure of the ground fault directionality detection neural network may be simplified, such as reducing convolution layers; for example, the number and size of convolution kernels included in each convolution layer may be modified, and the size of convolution kernel included in respective convolution layers may be different. Such changes or modifications can not be exhaustive herein.

For the convenience of understanding, the training process of the ground fault detection neural network shown in FIG. 5 according to the training method shown in FIG. 4 and the process of using the trained ground fault detection neural network to calculate the label vector V corresponding to the current signal I will be explained with a detailed example.

For convenience of explanation, the following settings are made for this example: the sampling resolution is k=48, the sampling range is N=1 cycles for each sampling, the number of convolution kernels contained in the convolution layer of the ground fault directionality detection neural network is 2, that is, n=2, and the size of convolution kernels 1 and 2 is 5×5, the cross-entropy loss function $L=-(y \log \hat{y}+(1-y) \log(1-\hat{y}))$ is used as processing loss function, the processing loss threshold $T_L$ is set to 0.01, and the activation function $\sigma(z)=1/(1+e^{-z})$ is used for the activation layer.

With this example, the training process of the ground fault directionality detection neural network shown in FIG. 5 according to the training method shown in FIG. 4 will be explained.

Corresponding to step S401, EMTP is used to generate 4000 numerical matrices representing sampled ground fault current signals as a training sample set, the training sample set includes 2000 numerical matrices corresponding to upstream fault current signals and 2000 numerical matrices corresponding to downstream fault current signals. These 4000 numerical matrices are randomly sorted and given the numbers $M_1 \sim M_{4000}$ in sequence. For the upstream fault current signal sample, its real label vector is [1,0], indicating that the probability of the sample being an upstream fault current signal is 1, and the probability of the sample being a downstream fault current signal is 0. For the downstream fault current signal sample, its real label vector should be [0,1], indicating that the probability of the sample being an upstream fault current signal is 0, and the probability of the sample being a downstream fault current signal is 1.

Corresponding to step S402, the training sample $M_1$ is provided to the ground fault directionality detection neural network. $M_1$ is known as the upstream fault current signal sample, and real label vector of it is [1,0].

Corresponding to step S403, the label vector $y_1$ corresponding to $M_1$ is output by the ground fault directionality detection neural network, for example, [0.4, 0.6], that is to say, at this time, the ground fault directionality detection neural network considers that the probability of the sample $M_1$ being an upstream fault current signal is 0.4, and the probability of being a downstream fault current signal is 0.6, which shows that the classification of the sample $M_1$ by the ground fault directionality detection neural network is completely wrong at this time.

Corresponding to step S404, based on the loss function $L_1=-(y \log \hat{y}+(1-y) \log(1-\hat{y}))$, the ground fault directionality detection neural network may determine its processing loss $L_1=-(1\times \log 0.4+0\times \log 0.6)=0.91$.

Corresponding to step S405, the ground fault directionality detection neural network judges that its processing loss $L_1=0.91 \geq T_L=0.01$.

Corresponding to step S406, the ground fault directionality detection neural network updates its parameters according to the back propagation algorithm, and these parameters include a weight matrix of convolution kernels 1 and 2 of the convolution layer with a size of 5×5, a weight matrix $W_1$ of the first fully connected layer with a size of 20×44 and a weight matrix $W_2$ of the second fully connected layer with a size of 2×20.

After the update is completed, the steps S402~S406 are repeated, that is, the training sample $M_2$ is provided to the ground fault directionality detection neural network, and then a feature extraction, classification, processing loss calculation, and the like are performed for the training sample $M_2$. Until it is judged in step S405 that the processing loss $L<T_L$, step S407 is executed, that is, the training ends.

After training, the determined 2×5×5 weight matrix corresponding to two convolution kernels, the determined 20×44 weight matrix corresponding to the weight matrix $W_1$ of the first fully connected layer and the determined 2×20 weight matrix corresponding to the weight matrix $W_2$ of the second fully connected layer will be obtained. These parameters together with the structure, loss function and activation function of the previously set ground fault directionality detection neural network constitute a trained ground fault directionality detection neural network.

It should be noted that the above simple examples are only for convenience of explanation, and do not limit the disclosure, and various modifications and changes may be made according to actual needs. For example, if a plurality of samples may be output at a time in step S402, the processing loss calculated in step S404 is an average value of the processing losses of these samples. Such changes or modifications can not be exhaustive herein.

The following continues to explain a process of detecting and calculating the label vector V corresponding to the current signal I by using the trained ground fault directionality detection neural network.

With reference to FIGS. 1 and 4, taking a detection process performed by the ground fault directionality detection device 100 configured in the relay R1 as an example, the ground fault detection device 100 detects the three-phase current signal I of the transformer converted by the current transformer, samples the current signal for N=1 cycle according to a sampling resolution k=48, and obtains a numerical matrix M with a size of 3×48, wherein one row of M represents a sampling value of one phase, as shown in $I_{ph1}$, $I_{ph2}$, and $I_{ph3}$ in FIG. 4.

After the numerical matrix M is input to the ground fault directionality detection neural network, two convolution kernels 1 and 2 included in the convolution layer are convolved with it respectively, and the convolution result of each convolution kernel with the numerical matrix M is a numerical vector including 22 values, thus the convolution result of the two convolution kernels with the numerical matrix M is a numerical matrix C with a size of 2×22.

Next, the numerical matrix C is expanded into one row or one column of the first fully connected layer. In this example, a numerical matrix $U_1$ with a size of 44×1 is obtained by expanding the numerical matrix C into one column.

Next, the numerical matrix $U_1$ is multiplied by a weight matrix $W_1$ with a size of 20×44 of the first fully connected layer to obtain a numerical matrix $U_2$ with a size of 20×1 as the second fully connected layer.

Then, the numerical matrix $U_2$ is multiplied by a weight matrix $W_2$ of the second fully connected layer with a size of 2×20 to obtain the weighted sum vector S.

At last, the weighted sum vector S is transformed into a label vector V by using the activation function G(z) of the activation layer. The activation function G(z) of the activation layer may include but is not limited to one of sigmoid function, relu function and tan h function.

Figure 6:
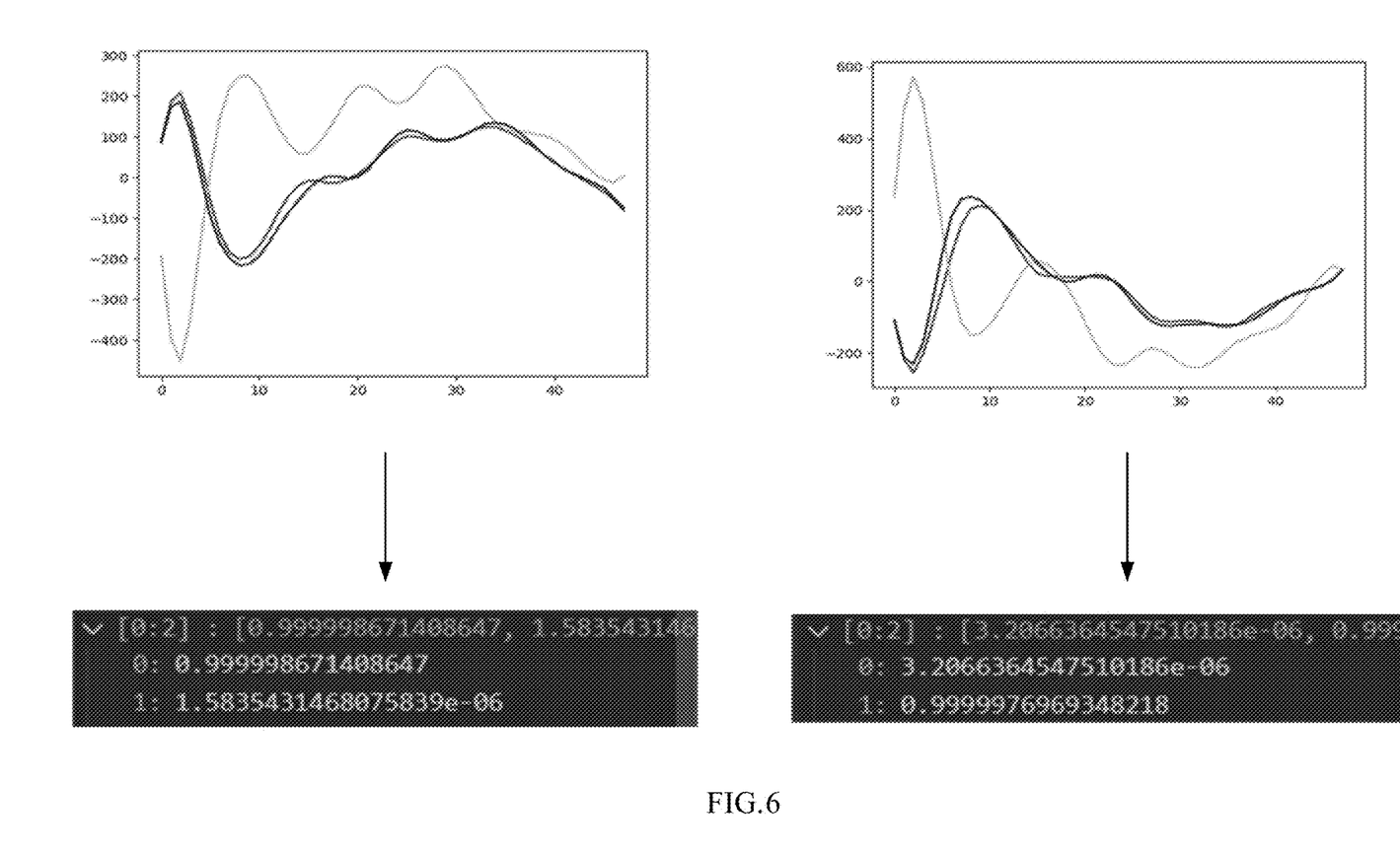
FIG. 6 shows a test result obtained by testing the ground fault directionality detection neural network according to an embodiment of the present disclosure.

FIG. 6 shows a test result obtained by testing the ground fault directionality detection neural network according to an embodiment of the present disclosure. On the left side of FIG. 6, an example of a ground fault current signal sample belonging to a downstream fault in the test sample set is shown, where the abscissa represents indexes of the sampling points, and the ordinate of which represents the value of current with the unit of ampere (A). Like the example described in connection with FIGS. 4 and 5, the ground fault current signal sample is sampled for one cycle with the sampling resolution of k=48, and a numerical matrix with a size of 3×48 is obtained. The numerical matrix is input into the ground fault directionality detection neural network, and the label vector calculated by the ground fault directionality detection neural network is [$1.5835431468075839e^{-06}$, 0.99998671408647], and the maximum value of 0.99998671408647 in the label vector represents a classification of a downstream fault, so the ground fault directionality detection neural network predicts this sample as a downstream fault current signal. On the right side of FIG. 6, an example of a ground fault current signal sample belonging to an upstream fault in the test sample set is shown, where the abscissa represents indexes of the sampling points, and the ordinate of which represents the value of current with the unit of ampere (A). Similarly, the sample is sampled for one cycle with the sampling resolution of k=48, and a numerical matrix with a size of 3×48 is obtained. The numerical matrix is input into the ground fault directionality detection neural network, and the label vector calculated by the ground fault directionality detection neural network is [0.999976969348218, $3.20664547510186e^{-06}$], as shown in the figure. The maximum value of 0.999976969348218 in the label vector V represents a classification of upstream fault, so the ground fault directionality detection neural network predicts this sample as an upstream fault current signal.

It should be noted that only two test samples are shown in FIG. 6 for illustration, but the number of samples in the test sample set may be determined according to actual needs, for example, it may be a proportion of the sample size of the training sample set, such as 20%, 30%, etc.

The test of the above exemplary convolutional neural network shows that the directionality detection method of ground fault according to the embodiment of the present disclosure may realize the directionality detection of ground fault only by performing feature extraction on the ground fault current signal. Obviously, it is clear to those skilled in the art that the ground fault directionality detection method disclosed in this disclosure is not limited to the above-mentioned exemplary convolutional neural network, and other suitable neural networks may also be used.

Figure 7:
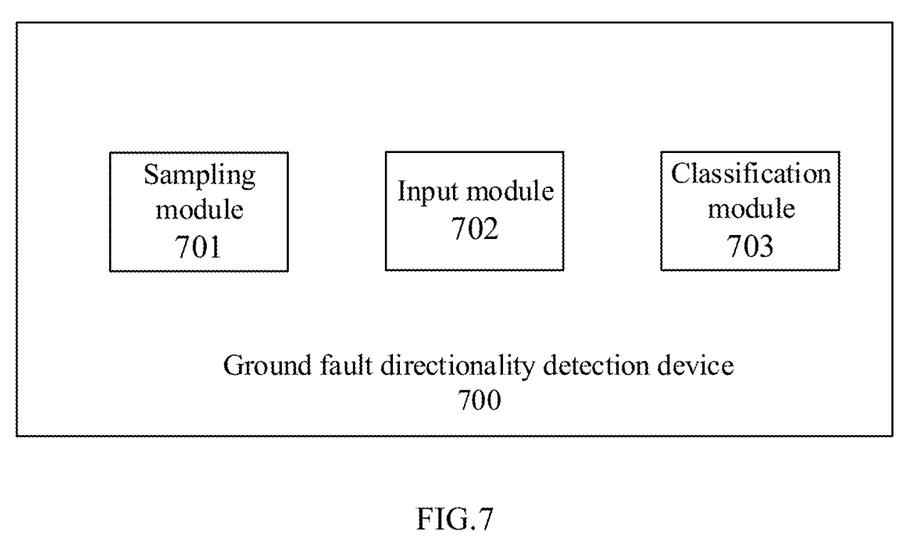
FIG. 7 is a module block diagram showing a ground fault directivity detection device according to an embodiment of the present disclosure.

FIG. 7 is a module block diagram showing a ground fault directivity detection device 700 according to an embodiment of the present disclosure.

As shown in FIG. 7, a ground fault directionality detection device 700 includes a sampling module 701, an input module 702, and a classification module 703. These three modules may be configured at the same physical location, for example, they are all integrated into the relays R1-R4 shown in FIG. 1, and they may also be integrated into other devices with computing capability on a line, for example, the fault passage indicator FPI. Alternatively, one or two of the three modules may be configured not in the same physical location as the other two or one, and connected via a wired or wireless communication network, so as to transmit data or commands between each other. For example, the sampling module 701 may be integrated into relays R1-R4 or fault passage indicator FPI, while the input module 702 and classification module 703 may be integrated into computing devices such as computers and servers in control rooms. Since a power device is allowed to run with faults for a period of time in a small current grounding system, the time spent on data and command transmission between the sampling module 701 and the input module 702 and/or the classification module 703 may not be considered.

The sampling module 701 is configured to sample at least a part of a current signal I to obtain a numerical matrix M. Its sampling resolution is k samples per power frequency cycle, for example, k=24, 32, 48, etc. And a sampling range of each sampling may be N cycles of the ground fault current signal I, for example, N=1, 2, etc.

The input module 702 provides the numerical matrix M acquired by the sampling module 701 as an input to a ground fault directionality detection neural network. Furthermore, the input module 702 may also detect whether the maximum value in the numerical matrix M is greater than the preset enabling threshold, and provide the numerical matrix M as an input to the ground fault directivity detection neural network only when a maximum value is greater than or equal to a preset enabling threshold.

A classification module 703, in which the ground fault directionality detection neural network according to an embodiment of the present disclosure is configured, and a label vector V corresponding to the numerical matrix M is output by the ground fault directionality detection neural network, wherein the label vector V indicates whether the current signal I is an upstream fault current signal or a downstream fault current signal. The ground fault directionality detection neural network also receives a ground fault confirmation signal and outputs the label vector V if the ground fault confirmation signal indicates that the current signal is a ground fault current signal.

Obviously, the above description about the ground fault directivity detection method is equally applicable to the ground fault directivity detection device 700, and will not be repeatedly described here.

Figure 8:
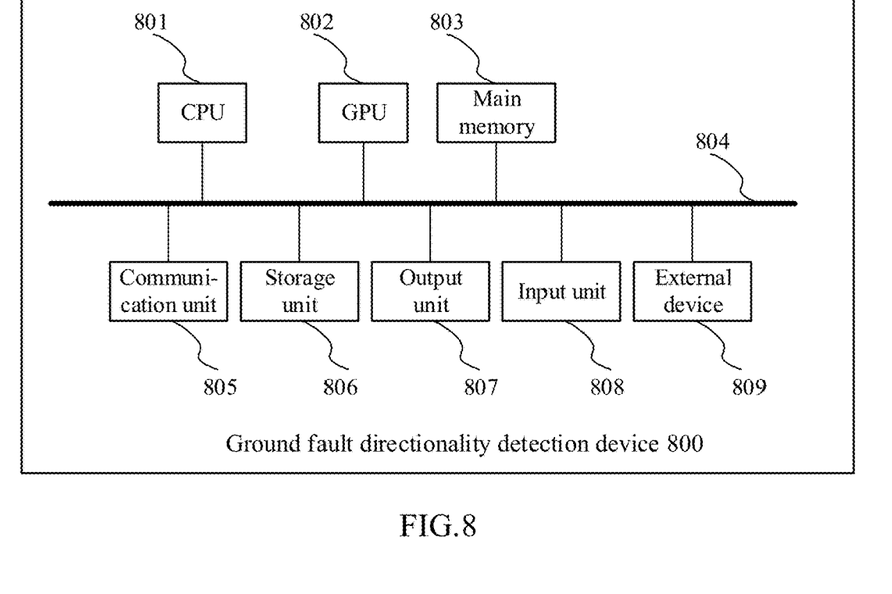
FIG. 8 is a hardware block diagram showing a ground fault directivity detection device according to another embodiment of the present disclosure.

FIG. 8 is a hardware block diagram showing a ground fault directivity detection device 800 according to another embodiment of the present disclosure.

An electronic device 800 according to an embodiment of the present disclosure includes at least a memory for storing computer program instructions and a processor for executing the computer program instructions. When the computer program instructions are loaded and run by the processor, the processor executes the training method of the ground fault directionality detection neural network and the ground fault detection method.

The ground fault directivity detection device 800 shown in FIG. 8 may specifically include a central processing unit (CPU) 801, a graphics processing unit (GPU) 802 and a main memory 803. These units are interconnected by bus 804. The central processing unit (CPU) 801 and/or the graphics processing unit (GPU) 802 may be used as the processor, and the main memory 803 may be used as the memory for storing computer program instructions. In addition, the electronic device 800 may further include a communication unit 805, a storage unit 806, an output unit 808, an input unit 808 and an external device 809, which are also connected to the bus 804.

Figure 9:
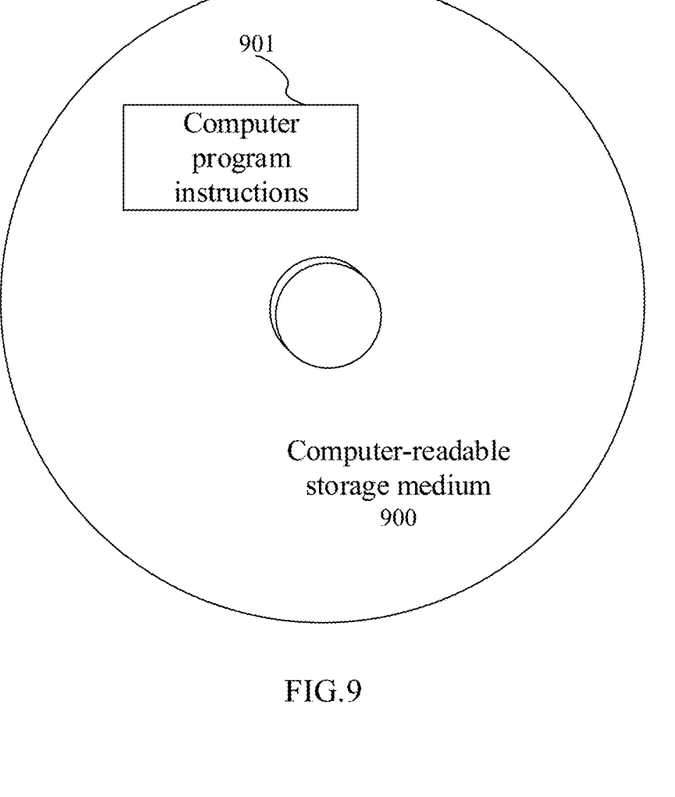
FIG. 9 is a schematic diagram illustrating a computer-readable storage medium according to an embodiment of the present disclosure.

FIG. 9 is a schematic diagram illustrating a computer-readable storage medium according to an embodiment of the present disclosure. As shown in FIG. 9, a computer-readable storage medium 900 according to an embodiment of the present disclosure has computer program instructions 901 stored thereon. When the computer program instructions 901 are executed by a processor, the training method of the ground fault directivity detection neural network and the ground fault directivity detection method according to the embodiments of the present disclosure described with reference to the above drawings are carried out.

The computer-readable storage medium includes, but is not limited to, volatile memory and/or nonvolatile memory, for example. The volatile memory may include random access memory (RAM) and/or cache, for example. The nonvolatile memory may include, for example, a read-only memory (ROM), a hard disk, a flash memory, an optical disk, a magnetic disk, and the like.

In the above, the method and device for detecting the directivity of ground fault based on a neural network according to the embodiment of the present disclosure are described with reference to the drawings. Based on the powerful feature extraction and classification functions of the neural network, the directionality detection method, the directionality detection device and the computer-readable storage medium based on the neural network may accurately judge that whether a ground fault is an upstream fault or a downstream fault without voltage information. The test results may help locate a source of a ground fault, so as to inform a corresponding maintenance team to carry out maintenance.

Those of ordinary skill in the art may realize that the units and algorithm steps of each example described in connection with the embodiments disclosed herein may be implemented in electronic hardware, or a combination of computer software and electronic hardware. Whether these functions are implemented in hardware or software depends on the specific application and design constraints of the technical scheme. Professionals may use different methods to implement the described functions for each specific application, but such implementation should not be considered beyond the scope of the present invention.

The basic principles of this disclosure have been described above with specific embodiments. However, it should be pointed out that, the advantages, benefits and effects mentioned in this disclosure are only examples and not limitations, and these advantages, benefits and effects cannot be considered as necessary for various embodiments of this disclosure. In addition, the specific details disclosed above are only for the purpose of illustration and easy understanding, but not for limitation. The above details do not limit the disclosure to the fact that it must be realized with specific details.

The block diagrams of means, apparatuses, devices and systems involved in this disclosure are only taken as illustrative examples and are not intended to require or imply that they must be connected, arranged and configured in the manner shown in the block diagram. As will be recognized by those skilled in the art, these means, apparatuses, devices and systems may be connected, arranged and configured in any manner. Words such as "including", "comprising", "having" and so on are open words, which mean "including but not limited to" and may be used interchangeably with them. As used herein, the words "or" and "and" refer to the words "and/or" and are used interchangeably with it, unless the context clearly indicates otherwise. As used herein, the word "such as" refers to the phrase "such as but not limited to" and may be used interchangeably with it.

In addition, as used herein, "or" used in an enumeration of items starting with "at least one" indicates a separate enumeration, so that an enumeration such as "at least one of A, B or C" means A or B or C, or AB or AC or BC, or ABC (i.e., A and B and C). Furthermore, the word "exemplary" does not mean that the described example is preferred or better than other examples.

It should also be pointed out that in the system and method of the present disclosure, each component or step may be decomposed and/or recombined. These decompositions and/or recombinations should be regarded as equivalents of the present disclosure.

Various changes, substitutions and modifications to the techniques described herein may be made without departing from the taught techniques defined by the appended claims. In addition, the scope of the claims of this disclosure is not limited to the specific aspects of the composition, means, methods or actions of processes, machines, manufactures, events described above. Composition, means, methods or actions of processes, machines, manufactures, events, which currently exist or are to be developed later, that perform substantially the same functions or achieve substantially the same results as the corresponding aspects described herein may be utilized. Therefore, the appended claims include composition, means, methods or actions of such processes, machines, manufactures, events within their scope.

The above description of the disclosed aspects is provided to enable any person skilled in the art to make or use the disclosure. Various modifications to these aspects will be readily apparent to those skilled in the art, and the general principles defined herein may be applied to other aspects without departing from the scope of this disclosure. Therefore, the disclosure is not intended to be limited to the aspects shown herein, but is to be accorded the widest scope consistent with the principles and novel features disclosed herein.

The above description has been given for purposes of illustration and description. Furthermore, this description is not intended to limit the embodiments of the disclosure to the forms disclosed herein. Although several example aspects and embodiments have been discussed above, those skilled in the art will recognize certain variations, modifications, changes, additions and sub-combinations thereof.

What is claimed is:

1. A ground fault directivity detection method, comprising:
    sampling at least a part of a current signal to obtain a numerical matrix;
    detecting whether a maximum value in the numerical matrix is greater than a preset enabling threshold;
    providing the numerical matrix as an input to a ground fault directionality detection neural network to predict whether the current signal is an upstream fault current signal or a downstream fault current signal in a case that the maximum value in the numerical matrix is greater than or equal to the preset enabling threshold, and detecting whether a maximum value in a next numerical matrix is greater than the preset enabling threshold in a case that the maximum value in the numerical matrix is smaller than the preset enabling threshold;
    calculating a label vector corresponding to the input by the ground fault directionality detection neural network in response to the input provided to the ground fault directionality detection neural network, wherein the label vector indicates whether the current signal is an upstream fault current signal or a downstream fault current signal;
    receiving a ground fault confirmation signal by the ground fault directionality detection neural network; and
    outputting the label vector by the ground fault directionality detection neural network when the ground fault confirmation signal indicates that the current signal is a ground fault current signal.

2. The ground fault directivity detection method of claim 1, wherein
    the current signal is a three-phase current signal, and one row or one column of the numerical matrix corresponds to one phase of the three-phase current signal.

3. The ground fault directivity detection method of claim 1, wherein
    the ground fault directionality detection neural network adopts a convolution neural network.

4. The ground fault directivity detection method of claim 1, wherein
    the ground fault directionality detection neural network is a trained neural network, and the training includes the following steps:
        step 1, acquiring a ground fault current signal training sample set for training the ground fault directionality detection neural network;
        step 2, providing a training sample in the ground fault current signal training sample set as an input to the ground fault directionality detection neural network;
        step 3, calculating a label vector corresponding to the training sample by the ground fault directionality detection neural network;
        step 4, determining a processing loss of the ground fault directionality detection neural network based on the label vector of the training sample;
        step 5: if the processing loss is greater than or equal to a preset processing loss threshold, updating a parameter of the ground fault directionality detection neural network and performing steps 2 to 5 based on the updated ground fault directionality detection neural network, and if the processing loss is less than or equal to the preset processing loss threshold, stopping the training.

5. The ground fault directivity detection method of claim 4, wherein
    the ground fault directionality detection neural network includes at least a convolution layer, a first fully connected layer, a second fully connected layer, an activation layer and an output layer; and
    the parameter of the ground fault directionality detection neural network include at least a weight matrix of a convolution kernel included in the convolution layer, a first weight matrix included in the first fully connected layer, and a second weight matrix included in the second fully connected layer.

6. The ground fault directivity detection method of claim 5, wherein
    the ground fault directionality detection neural network may also include a pooling layer.

7. The ground fault directivity detection method of claim 6, wherein
    the convolution layer adopts a convolution kernel with a size of 5×5; and
    the activation function is one of sigmoid function, relu function and tanh function.

8. The ground fault directivity detection method of claim 4, wherein
    one or more training samples in the ground fault current signal training sample set are generated by an Electro-Magnetic Transient Program EMTP.

9. A ground fault directivity detection device, comprising:
    a sampling module, configured to sample at least a part of a current signal to obtain a numerical matrix;
    an input module, configured to detect whether a maximum value in the numerical matrix is greater than a preset enabling threshold, provide the numerical matrix as an input to a ground fault directionality detection neural network to predict whether the current signal is an upstream fault current signal or a downstream fault current signal in a case that the maximum value in the numerical matrix is greater than or equal to the preset enabling threshold, and detect whether a maximum value in a next numerical matrix is greater than the preset enabling threshold in a case that the maximum value in the numerical matrix is smaller than the preset enabling threshold; and
    a classification module, configured with the ground fault directionality detection neural network, wherein the ground fault directionality detection neural network calculates a label vector corresponding to the input in response to the input provided to the ground fault directionality detection neural network, wherein the label vector indicates whether the current signal is an upstream fault current signal or a downstream fault current signal, and the ground fault directionality detection neural network also receives a ground fault confirmation signal, and outputs the label vector when the ground fault confirmation signal indicates that the current signal is a ground fault current signal.

10. A ground fault directivity detection device comprises:
a processor; and
a memory, wherein a computer-executable program is stored in the memory, and when the program is executed by the processor, the device is caused to execute the method according to claim 1.

11. A non-transitory computer-readable storage medium having stored thereon computer instructions which, when executed by a processor, implement the method according to claim 1.

* * * * *